(12) United States Patent
Baek

(10) Patent No.: US 7,537,986 B2
(45) Date of Patent: May 26, 2009

(54) SEMICONDUCTOR DEVICE AND METHOD FOR MANUFACTURING THE SAME

(75) Inventor: Seung Joo Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 349 days.

(21) Appl. No.: 11/481,502

(22) Filed: Jul. 5, 2006

(65) Prior Publication Data

US 2007/0170497 A1    Jul. 26, 2007

(30) Foreign Application Priority Data

Jan. 23, 2006   (KR) .................. 10-2006-0006986

(51) Int. Cl.
*H01L 21/337* (2006.01)
(52) U.S. Cl. ..................................................... 438/195

(58) Field of Classification Search ................. 438/158, 438/178, 195–196
See application file for complete search history.

(56) References Cited

U.S. PATENT DOCUMENTS

| 7,361,945 B2* | 4/2008 | Kim ........................... 257/192 |
| 2005/0136616 A1 | 6/2005 | Cho et al. |
| 2007/0057312 A1* | 3/2007 | Kim ........................... 257/315 |

FOREIGN PATENT DOCUMENTS

JP         2003-86766 A       3/2003

* cited by examiner

*Primary Examiner*—Calvin Lee
(74) *Attorney, Agent, or Firm*—Townsend and Townsend and Crew LLP

(57) ABSTRACT

A semiconductor device comprises an active region formed in a semiconductor substrate; a recess region being formed within the active region and defining a protruding portion; and a gate structure formed within the recess region.

13 Claims, 11 Drawing Sheets

SEMICONDUCTOR DEVICE AND METHOD FOR MANUFACTURING THE SAME

BACKGROUND OF THE INVENTION

The present invention relates to a semiconductor device and a method for manufacturing the same. More specifically, the present invention relates to a process of forming a bar-shaped protruding portion at the bottom of a recess region to increase channel length and width of a gate so as to improve the process margin of a semiconductor device, thereby improving the electric characteristics of a semiconductor device.

Due to the high integration of semiconductor devices, the process margins for forming an active region and a device isolation film has decreased. Also, as the width of gates has become smaller, the channel length becomes smaller, which results in a short channel effect, degrading electric characteristics of the semiconductor devices. In order to prevent short channel effects, a recess gate has been used which increases the channel length of the gate by etching a gate location region at a predetermined thickness to increase the contact area between the active region and the gate.

FIG. 1 is a plane diagram illustrating a conventional semiconductor device. Referring to FIG. 1, an active region 20 and a device isolation film 30 are formed over a semiconductor substrate 10. Then, a recess region 60 is formed where the active region 20 of a gate location region 75 is etched.

FIG. 2 shows a cross-section A-A' in FIG. 1. A gate 70 is formed over a recess region 60. The channel length is shown to get longer by the recess region 60.

However, as the semiconductor device becomes smaller, there is a limit to increasing the channel length using the recess region, and also it becomes difficult to create a subsequent landing plug contact region. Since the width of the recess region becomes smaller and the depth of the recess region becomes deeper to obtain a predetermined channel length, the process margin for forming the recess region has been lessened.

SUMMARY OF THE INVENTION

According to an embodiment of the present invention, a semiconductor device comprises of an active region formed over a semiconductor substrate and a recess region formed over a region where the active region and a gate overlap. A bar-shaped protruding portion is formed at the bottom of the recess region.

According to an embodiment of the present invention, a method for forming a semiconductor device comprises of:

(a) forming a device separating structure which defines an active region over a semiconductor substrate;

(b) forming a first hard mask pattern which partially exposes both edges of a region where the active region and a gate overlap over the semiconductor substrate;

(c) etching the active region with the first hard mask pattern to form first etching regions;

(d) removing the first hard mask pattern to fill a SOD material in the first etching regions;

(e) forming a second hard mask pattern which exposes an active region between the first etching regions over the semiconductor substrate;

(f) etching the active region with the second hard mask pattern at a depth shallower than that of the first etching region to form a second etching region; and (g) removing the second hard mask pattern and the SOD material to form a recess region whose bottom has a bar-shaped protruding portion by the first etching region and the second etching region.

The first hard mask pattern of step (b) may be used to expose both edges of the region where the active region and the gate are overlapped in a direction parallel or perpendicular to the gate line to have a bar shape with a predetermined width. The first hard mask pattern and the second hard mask pattern may include a carbon layer.

According to one embodiment, a semiconductor device includes an active region formed in a semiconductor substrate; a recess region being formed within the active region and defining a protruding portion; and a gate structure defined along a gate line and formed within the recess region. The protruding portion is bar-shaped. The protruding portion extends along the gate line. Alternatively, the protruding portion is formed perpendicular to the gate line.

According to another embodiment, a method for forming a semiconductor device includes forming an active region in a semiconductor substrate; etching the active region to form first and second trenches, the first and second trenches defining a vertical structure therebetween; etching the vertical structure to form a protruding portion within a recess region; and filling the first and second trenches with a conductive material to define a gate structure.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

Figure 1:
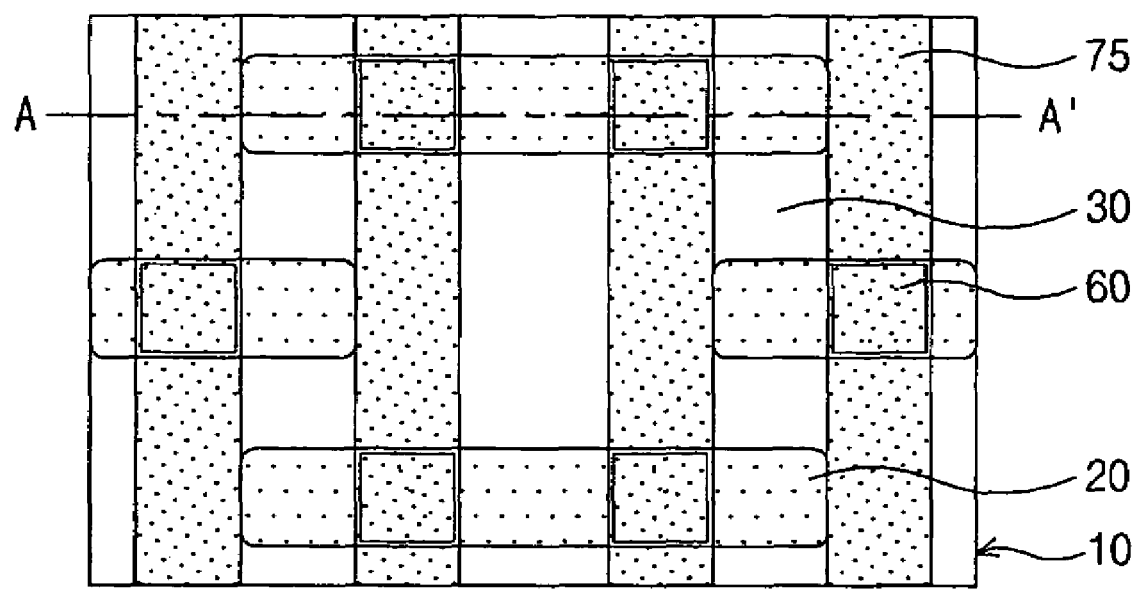
FIG. 1 is a plane diagram illustrating a conventional semiconductor device.
Figure 2:
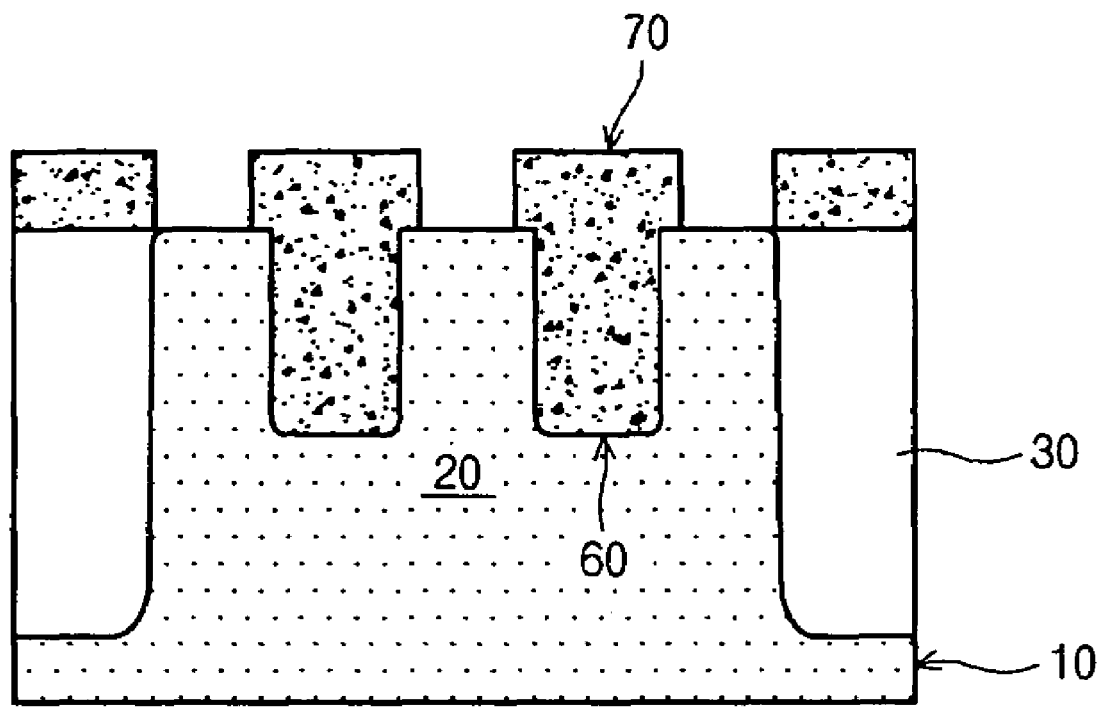
FIG. 2 is a cross-sectional diagram illustrating a conventional semiconductor device.
Figure 3:
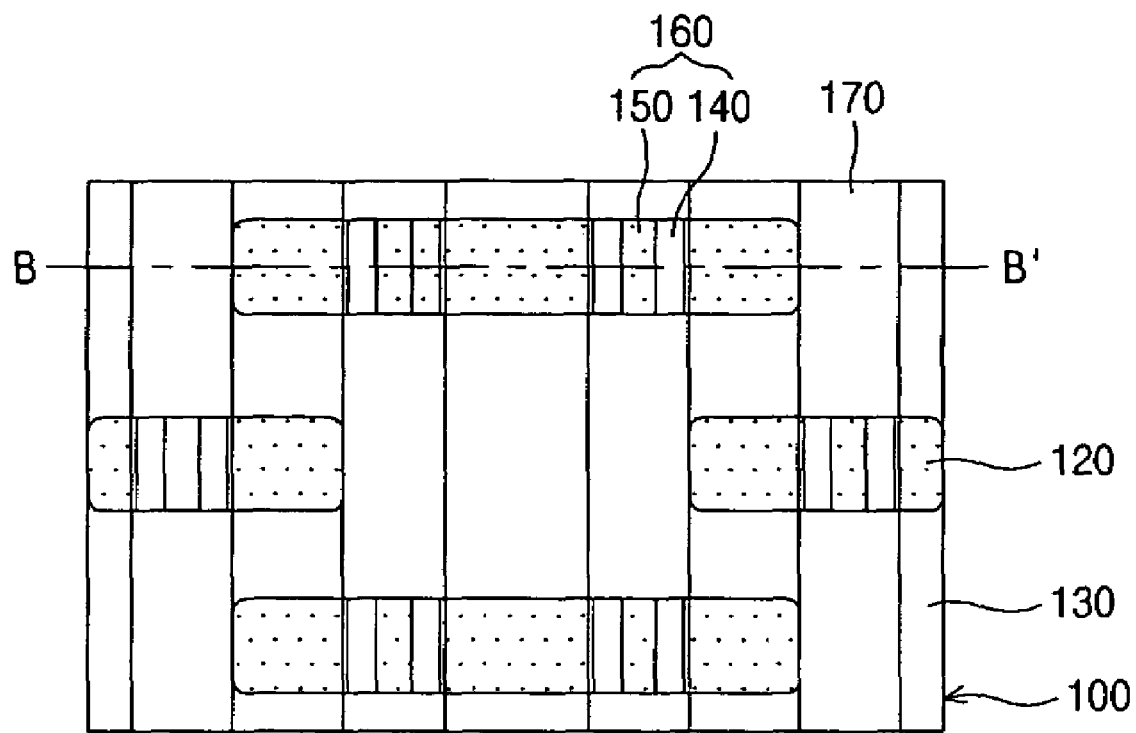
FIG. 3 is a plane diagram illustrating a semiconductor device according to an embodiment of the present invention.

FIG. 3 is a plane diagram illustrating a semiconductor device according to an embodiment of the present invention. Referring to FIG. 3, an active region 120 is defined over a semiconductor substrate 100 by a device isolation structure 130, and a recess region 160 is formed in a region where an active region 120 and a gate 170 overlap. A bar-shaped protruding portion 150 is formed at the bottom of the recess region 160.

The protruding portion 150 is formed parallel to the lengthwise direction of a gate (i.e., parallel to the gate line). The protruding portion 150 is formed to have a bar shape by using a first etching region 140 to etch both edges of the recess region 160 in parallel to the lengthwise direction of the gate.

FIGS. 4a through 4g are cross-sectional views cut along B-B' of FIG. 3 according to an embodiment of the present invention.

Figure 4A:
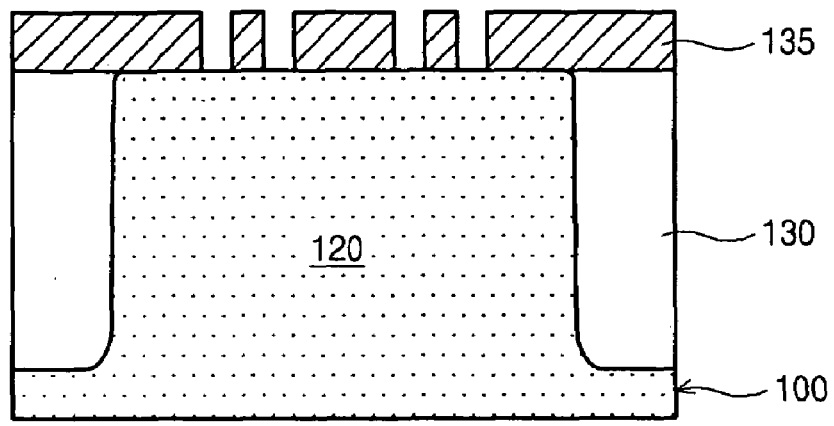
FIGS. 4a through 4g are cross-sectional diagrams illustrating a first example of a semiconductor device according to an embodiment of the present invention.

Referring to FIG. 4a, the device isolation structure 130 which defines the active region 120 is formed over the semiconductor substrate 100. Preferably, the device isolation structure 130 is formed by a STI (Shallow Trench Isolation) process. Then, a first hard mask pattern 135 which partially exposes both edges of the region where the active 120 and the gate are overlapped during a subsequent process is formed over the semiconductor substrate 100. The first hard mask pattern 135 exposes both edges of the region where the active region 120 and the gate overlap in parallel to the lengthwise direction (or gate line direction) of the gate to have a bar-shape with a predetermined width. The first hard mask pattern 135 may include a carbon layer to prevent damage of the hard mask layers during an etching process because the exposed region has a fine pattern.

Figure 4B:
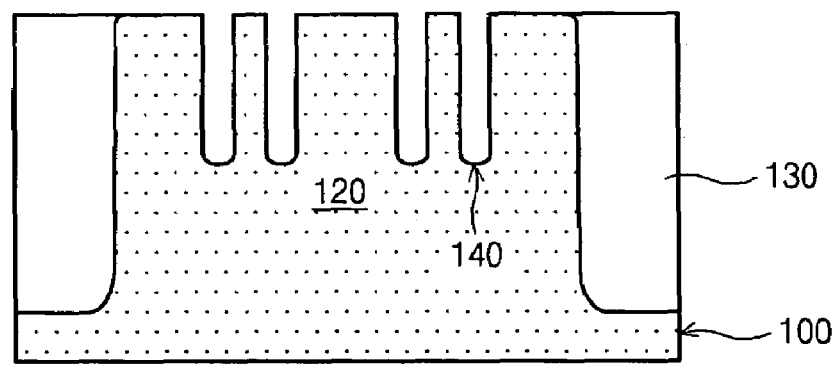

Referring to FIG. 4b, the active region 120 is etched with the first hard mask pattern 135, and a first etching region 140 is formed. Then, the first hard mask pattern 135 is removed.

Figure 4C:
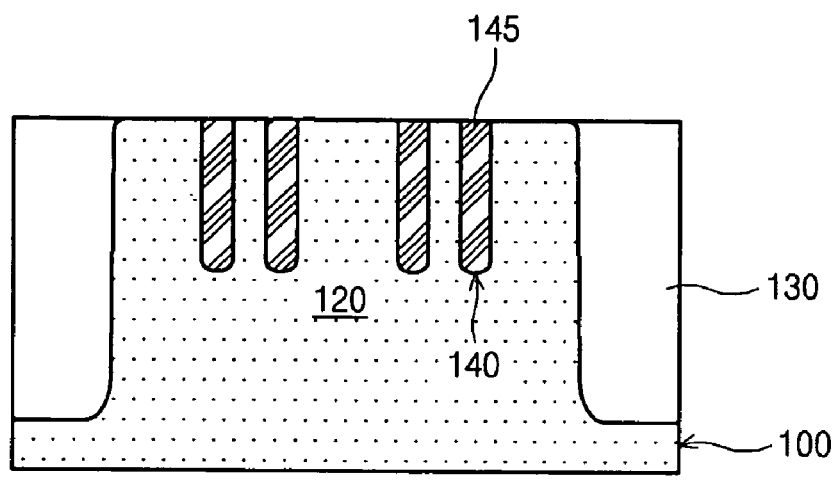

Referring to FIG. 4c, a Spin-On-Dielectric ("SOD") material 145 is filled in the first etching region 140 of FIG. 4b. Since the SOD material 145 has excellent filling characteristics, it is easy to fill the SOD material in the first etching region 140 although the first etching region 140 is finely formed.

Figure 4D:
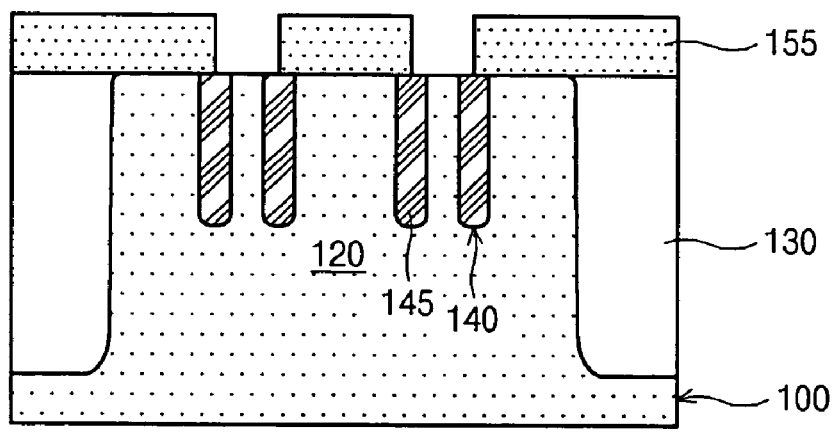

Referring to FIG. 4d, a second hard mask pattern 155 which exposes the active region 120 between the first etching regions 140 is formed over the semiconductor substrate 100. The second hard mask pattern 155 may include a carbon layer.

Figure 4E:
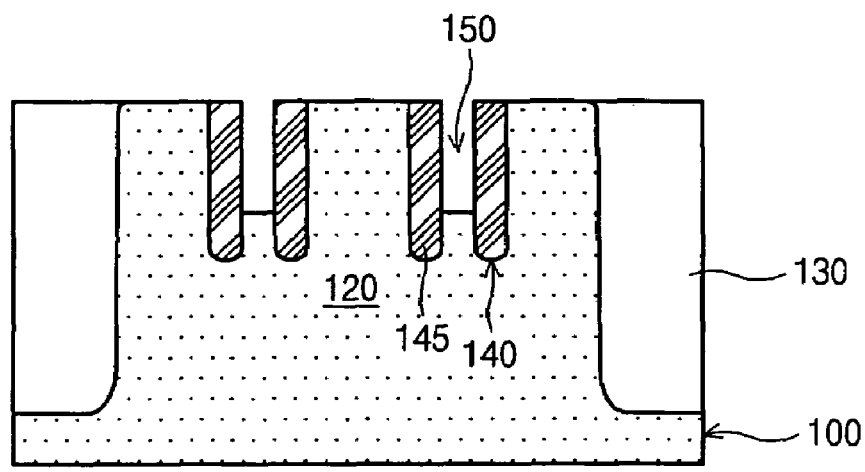

Referring to FIG. 4e, the active region 120 is etched with the second hard mask pattern 155 at a depth deeper than that of the first etching region 140 from the surface of the semiconductor substrate 100 to form a second etching region. As a result, the protruding portion 150 is formed by the first etching region 140 and the second etching region. Then, the second hard mask pattern 155 is removed.

Figure 4F:
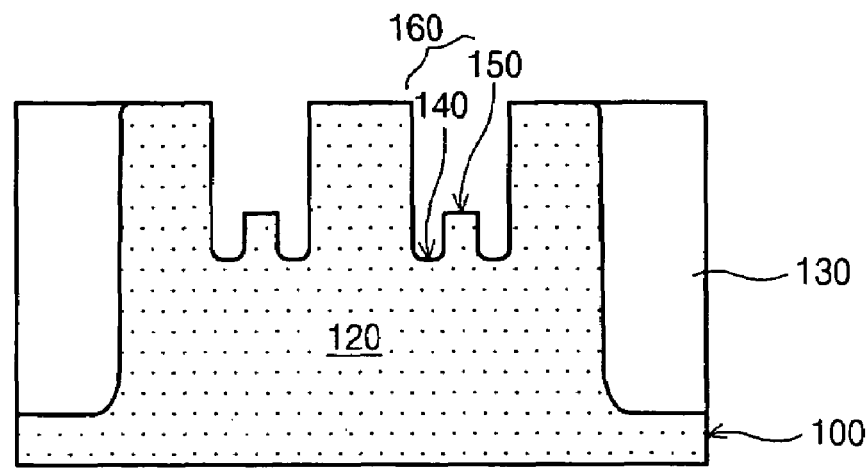

Referring to FIG. 4f, the SOD material 145 is removed and the recess region 160, whose bottom has the bar-shaped protruding portion 150, is formed by the first etching region 140 and the second etching region.

Figure 4G:
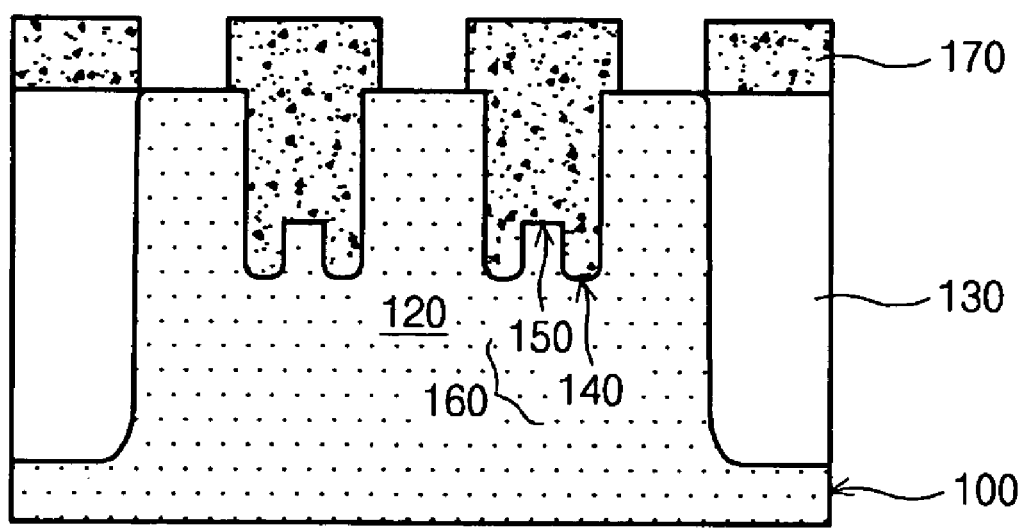

Referring to FIG. 4g, the gate 170 is formed over the recess region 160. Although the depth of the first etching region 140 is not deep, it is possible to obtain a meaningful amount of the channel length by the protruding portion 150, thereby increasing the process margin for forming the recess region.

Figure 5:
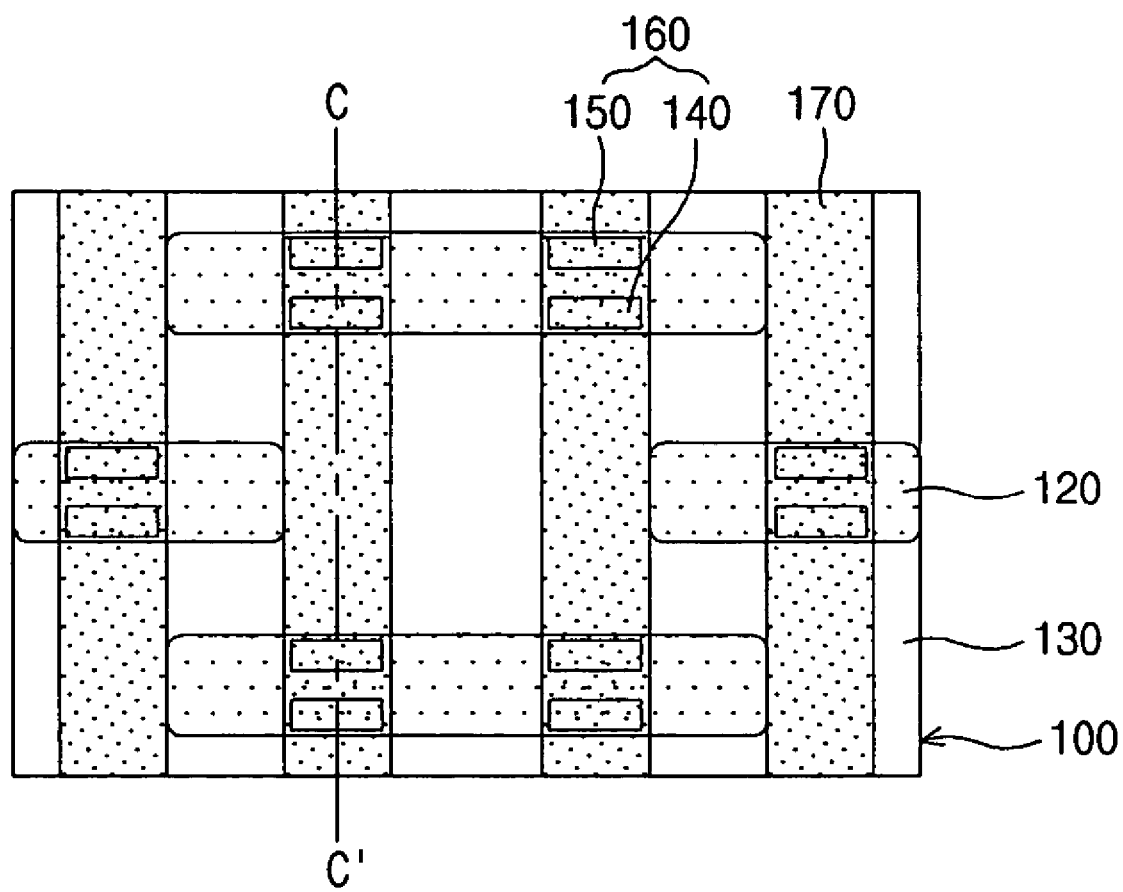
FIG. 5 is a plane diagram illustrating a second example of a semiconductor device according to an embodiment of the present invention.

FIG. 5 is a plane diagram illustrating a second example of a semiconductor device according to an embodiment of the present invention.

Referring to FIG. 5, the bar-shaped protruding portion 150 formed perpendicular to the lengthwise direction of the gate at the bottom of the recess region 160. The process for forming the protruding portion 150 follows that of FIGS. 4a through 4g.

Figure 6:
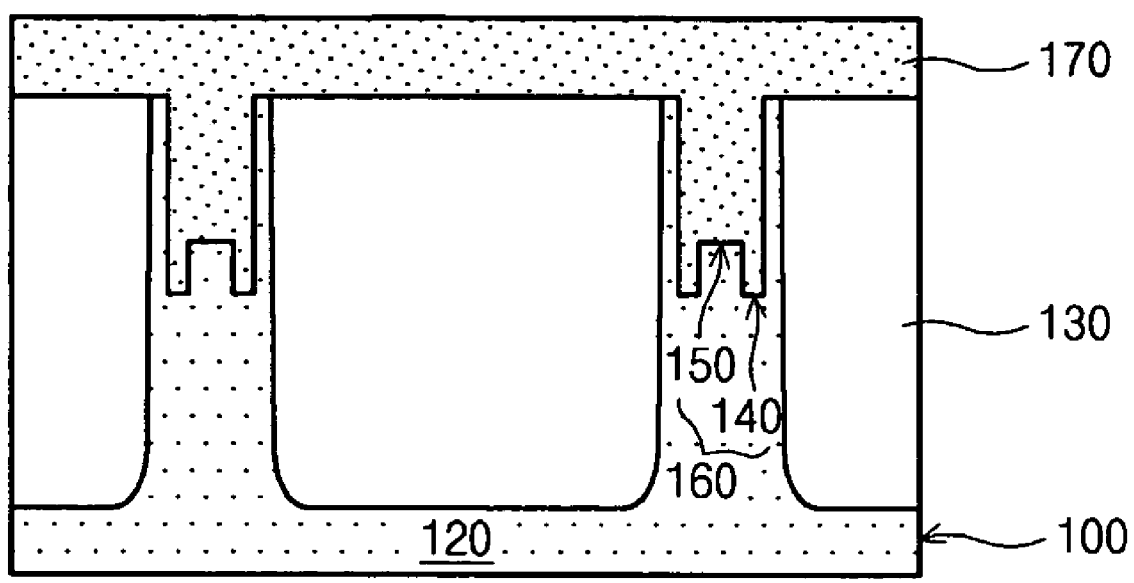
FIG. 6 is a cross-sectional diagram illustrating the second example of the semiconductor device according to an embodiment of the present invention.

FIG. 6 is a cross-sectional diagram illustrating a semiconductor device according to an embodiment of the present invention, and shows cross-section C-C' from FIG. 5.

Referring to FIG. 6, a channel width is shown to increase toward the cross-section in the lengthwise direction of the gate 170 by the first etching region 140 and the protruding portion 150.

Figure 7:
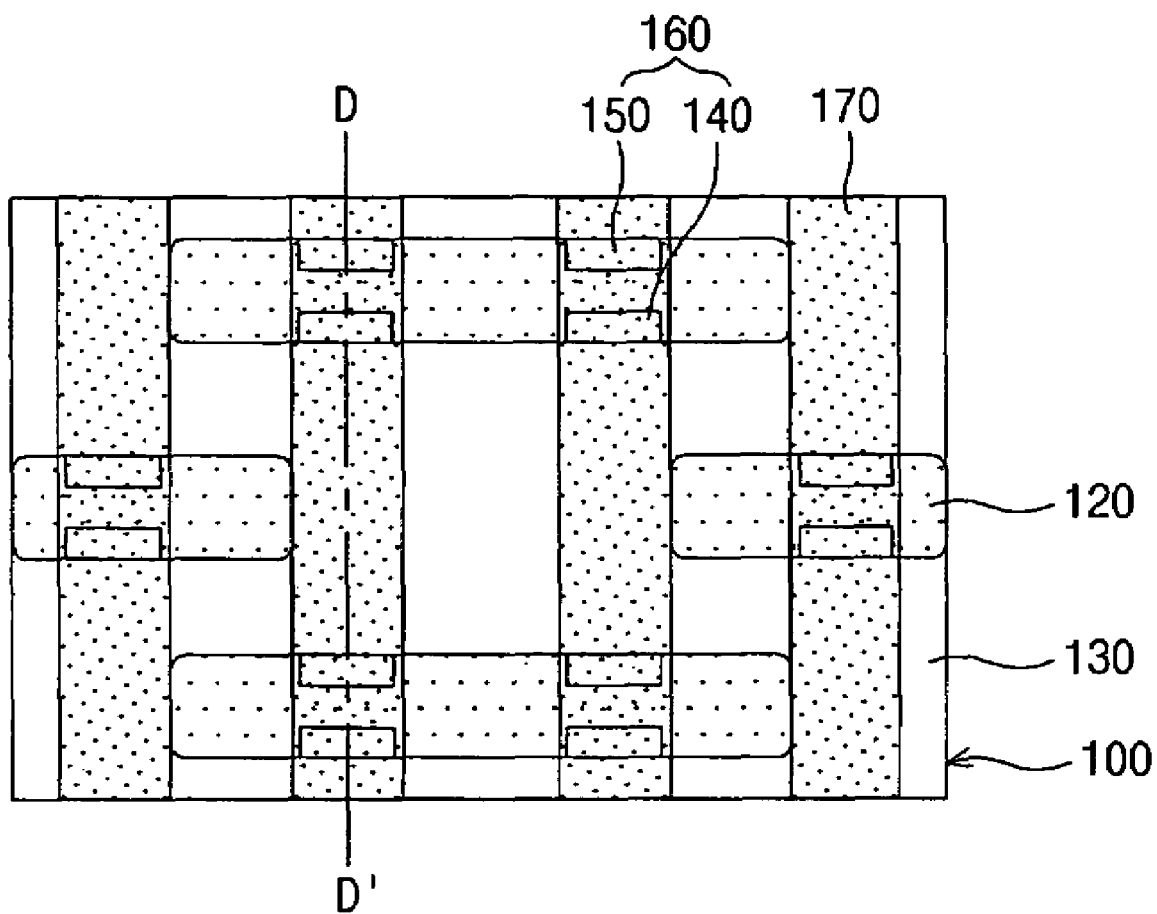
FIG. 7 is a plane diagram illustrating a third example of a semiconductor device according to an embodiment of the present invention.

FIG. 7 is a plane diagram illustrating a third example of a semiconductor device according to an embodiment of the present invention.

Figure 8:
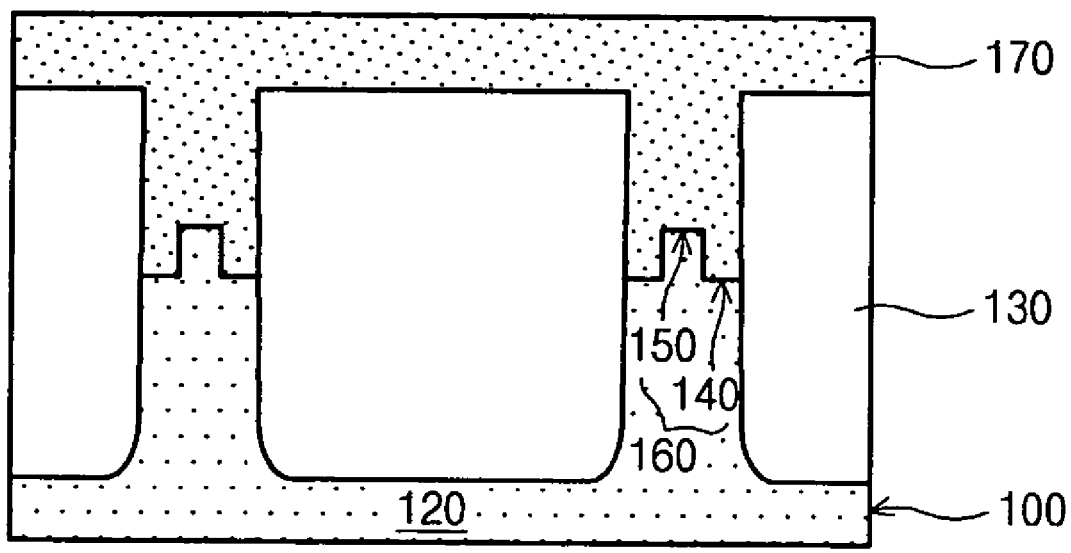
FIG. 8 is a cross-sectional diagram illustrating the third example of the semiconductor device according to an embodiment of the present invention.

FIG. 8 is a cross-sectional diagram illustrating the third example of the semiconductor device according to an embodiment of the present invention, and shows cross-section D-D' from FIG. 7.

Referring to FIGS. 7 and 8, the device isolation structure 130 is exposed by the first etching region 140 for forming the recess region 160.

In order to form the first etching region 140 perpendicular to the lengthwise direction (or gate line direction) of the gate, the channel width of sufficient dimension is needed to enable the current to flow and improve the electric characteristics of the semiconductor device.

In the present embodiment, in order to improve the process margin of the recess region, a bar-shaped protruding portion is formed at the bottom of a recess region to increase the channel length and width of a gate, thereby improving electric characteristics of semiconductor device. As a result, the recess region can be expanded to reduce the threshold voltage of the gate and also improve refresh characteristics, thereby minimizing the short channel effects.

The foregoing description of various embodiments of the invention has been presented for the purpose of illustrating the invention. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and to enable one skilled in the art to utilize the invention in various embodiments and with various modifications as are suited to the particular need.

What is claimed is:

1. A method for forming a semiconductor device, the method comprising:
    forming an active region in a semiconductor substrate;
    etching the active region to form a first trench and a second trench in a recess region, wherein a vertical structure is formed between the first trench and the second trench;
    etching the vertical structure to form a protruding portion on a bottom of the recess region; and
    filling the first and second trenches with a conductive material to define a gate structure.

2. The method of claim 1, further comprising:
    forming a first hard mask pattern over the semiconductor substrate to define the first and second trenches; and
    filling the first and second trenches with dielectric material.

3. The method of claim 2, wherein the dielectric material is a Spin-On-Dielectric (SOD) material.

4. The method of claim 2, further comprising:
    removing the first hard mask pattern.

5. The method of claim 4, further comprising:
    forming a second hard mask pattern that exposes the vertical structure, wherein the vertical structure is etched using the second hard mask pattern to a depth that is shallower than that of the first or second trench.

6. The method according to claim 5, wherein the first hard mask pattern and the second hard mask pattern each includes a carbon layer.

7. The method of claim 1, wherein the protruding portion is bar-shaped.

8. The method of claim 7, wherein the protruding portion is parallel to a gate line extending along a given direction.

9. The method of claim 7, wherein the protruding portion is perpendicular to a gate line extending along a given direction.

10. A semiconductor device comprising:
 an active region formed in a semiconductor substrate;
 a recess region formed in the active region, wherein a protruding portion is formed on a bottom of the recess region; and
 a gate structure formed along a gate line and within the recess region.

11. The semiconductor device according to claim 10, wherein the protruding portion is bar-shaped.

12. The semiconductor device according to claim 10, wherein the protruding portion is formed along the gate line.

13. The semiconductor device according to claim 10, wherein the protruding portion is formed perpendicular to the gate line.

* * * * *